United States Patent [19]

Capasso et al.

[11] Patent Number: 4,686,550
[45] Date of Patent: Aug. 11, 1987

[54] HETEROJUNCTION SEMICONDUCTOR DEVICES HAVING A DOPING INTERFACE DIPOLE

[75] Inventors: Federico Capasso, Westfield; Alfred Y. Cho, Summit, both of N.J.

[73] Assignee: American Telephone and Telegraph Company, AT&T Bell Laboratories, Murray Hill, N.J.

[21] Appl. No.: 677,795

[22] Filed: Dec. 4, 1984

[51] Int. Cl.[4] .......................................... H01L 29/161
[52] U.S. Cl. ......................................... 357/16; 357/4; 357/14; 357/17; 357/58; 357/89
[58] Field of Search ................... 357/4 SL, 16, 22 A, 357/13, 14, 17, 4, 89, 20, 58

[56] References Cited

U.S. PATENT DOCUMENTS

| 3,882,533 | 5/1975 | Dohler | 357/58 |
| 4,291,320 | 9/1981 | Wen et al. | 357/16 X |
| 4,410,902 | 10/1983 | Malik | 357/13 |
| 4,476,477 | 10/1984 | Capasso et al. | 357/30 |
| 4,538,165 | 8/1985 | Chang et al. | 357/16 X |
| 4,553,317 | 11/1985 | Sakaki et al. | 357/16 X |
| 4,607,272 | 8/1986 | Osbourn | 357/16 X |

FOREIGN PATENT DOCUMENTS 58-142574 8/1983 Japan ......................... 357/4 SL

OTHER PUBLICATIONS

Döhler, G. H., "Solid-State Superlattices", Scientific American, Nov. 1983, pp. 144-151.
"Superlattice and Negative Differential Conductivity in Semiconductors", IBM Journal of Research and Development, 14, L. Esaki et al, (1970), pp. 61-65.
"Electron States in Crystals with 'Nipi-Superstructure'", Phys. Stat. Sol., '52, G. H. Dohler, (1972), pp. 79-92.
"Electrical and Optical Properties of Crystals with 'Nipi-Superstructure'", Phys. Stat. Sol., 52, G. H. Dohler, (1972), pp. 533-544.
"Effect of Ultrasonics on the Electron Spectrum of Crystals", Soviet Physics Solid State, L. V. Keldysh, (1962), pp. 1658-1659.
"Semiconductor Structures for Repeated Velocity Overshoot", IEEE Electron Device Letters, vol. EDL-3, No. 12, J. A. Cooper, Jr. et al., (1982), pp. 407-408.
"Planar-Doped Barriers in GaAs by Molecular Beam Epitaxy", Electronics Letters, vol. 16, No. 22, R. J. Malik et al., (1980), pp. 836-838.
"New Rectifying Semiconductor Structure by Molecular Beam Epitaxy", Applied Physics Letters, 36(5), C. L. Allyn et al., (1980), pp. 373-376.
"Staircase Solid-State Photomultipliers and Avalanche Photodiodes with Enhanced Ionization Rates Ratio", IEEE Transactions on Electron Devices, ED-30, No. 4, F. Capasso et al., (1983), pp. 381-390.
Surface Science, 132, (1983), North-Holland Publishing Company, R. S. Bauer, Guest Editor, pp. 456-464, 469-478, 513-518, 543-576.

Primary Examiner—Andrew J. James
Assistant Examiner—S. W. Crane
Attorney, Agent, or Firm—Richard D. Laumann

[57] ABSTRACT

Heterojunction devices having doping interface dipoles near the heterojunction interface are disclosed. The doping interface dipoles comprise two charge sheets of different conductivity type which are positioned within a carrier mean free path of the heterojunction interface.

29 Claims, 17 Drawing Figures

HETEROJUNCTION SEMICONDUCTOR DEVICES HAVING A DOPING INTERFACE DIPOLE

TECHNICAL FIELD

This invention relates generally to semiconductor heterojunction devices and particularly to such devices having microcapacitors in the form of a doping interface depole near the heterojunction interface which permits selective tuning of the energy band diagram.

BACKGROUND OF THE INVENTION

Semiconductor devices having heterojunctions are of considerable interest today for use in, for example, lasers, light-emitting diodes, bipolar and field effect transistors, and photodetectors as well as other types of devices. A heterojunction is a junction between two different semiconductors which may have either the same or opposite conductivity types. Semiconductor heterojunction devices may be usefully fabricated with more than one heterojunction. For example, a typical semiconductor laser in commercial use at the present time has two heterojunctions. Devices may be fabricated with numerous heterojunctions formed by interleaving layers of two different semiconductors. If the layers are ultra-thin, i.e., quantum size effects are significant, the resulting structure is commonly termed a "superlattice" and may be used in many types of devices. One type of device is of interest because it has interesting transport porperties, such as, for example, negative differential resistance. See, *IBM Journal of Research and Development*, 14, pp. 61–65, 1970. Alternatively, the superlattice could be produced by varying the conductivity type. Thus, superlattices may be formed without a heterojunction.

Superlattice structures having a spatially varying potential produced by thin, highly doped regions of alternating conductivity types separated by regions of intrinsic conductivity have also been disclosed. Such a structure is commonly termed a "nipi" structure and is described in, for example, *Phys. Stat. Sol.*, 52, pp. 79–92 and pp. 533–544, 1972. Also, see U.S. Pat. No. 3,882,533 issued on May 6, 1975 to G. H. Dohler. Although the optical and electrical properties, including carrier transport properties, are varied by the disclosed structure from the properties of the undoped structure, the described devices use only a single semiconductor material.

Other techniques have been proposed to form a superlattice and modify carrier transport properties. For example, the use of ultrasonic waves to form spatially periodic variations in the carrier conduction properties is disclosed in *Soviet Physics Solid State*, pp. 1658–1659, August 1962. Use of the structure as, for example, a high frequency oscillator is suggested.

Yet another use of charge sheets, which may also be referred to as planar doped charge sheets, is described in *IEEE Electron Device Letters*, EDL-3, pp. 407–408, December 1982. A charge sheet is a highly doped region having a thickness in one direction, which may be either parallel or perpendicular to the carrier transport direction, that is small compared to the two other spatial dimensions of the sheet. The structure described is termed a "repeated velocity overshoot structure" and utilizes nonsteady-state electron transport. This type of transport is obtained by using planar doped charge sheets having alternating conductivity types located within a region of intrinsic conductivity which, in turn, is located between n- and p-type regions. The dipole field of the pair of charge sheets shifts the electron energy distribution to higher energies and thereby enables velocity overshoot to occur repeatedly. Also disclosed is the use of a graded bandgap repeated overshoot device.

Use of a single planar doped layer in an intrinsic conductivity region sandwiched between two highly doped, identical conductivity type regions in a device is described in *Electronics Letters*, 16, pp. 836–838, Oct. 23, 1980. This structure, termed a "planar doped barrier", permits asymmetric current-voltage characteristics to be obtained. Variations in the barrier position and the charge density in the barrier permit different barrier heights and positions to be obtained.

In many heterojunction device applications, the energy band discontinuities, detract from the desired carrier transport properties when charges are trapped at or near the interface because they lack sufficient energy to surmount the energy barrier. Charge trapping is undesirable in, for example, photodetectors because it adversely affects the device response time. For this as well as for other reasons, the concept of graded bandgap structures, i.e., the semiconductor composition is varied in a manner such that the energy bandgap is also varied, has been introduced to desirably modify device properties. Such graded bandgap structures are useful in many applications. See, for example, *Applied Physics Letters*, 36, pp. 373–376, Mar. 1, 1980, which discusses a rectifying structure. See also, for example, *IEEE Transactions on Electron Devices*, ED-30, pp. 381–390, April 1983, which discusses avalanche photodetectors. U.S. Pat. No. 4,476,477 issued on Oct. 9, 1984 to F. Capasso, W. T. Tsang, and G. F. Williams, describes the use of charge sheets having alternating conductivity types positioned in a graded bandgap region near a heterojunction having an abrupt stepback to a lower bandgap to increase the carrier ionization rate in an avalanche photodetector. The charge sheets are desirably positioned so that their effect is to increase the carrier energy. While graded bandgaps have many advantageous applications, they may be undesirable in some applications because they do not always preserve the abruptness of the heterojunction. Of course, in other devices such as field effect transistors, the energy band discontinuity is desirable because it provides carrier confinement.

Detailed consideration of the discussed reference indicates that they typically consider the energy band discontinuities, as well as the barrier heights, in heterojunction devices as unalterable characteristics of either the device or the semiconductor heterojunction. There has been some speculation that growth conditions, substrate orientation and even defects near the interface may have an effect on heterojunction properties. See, for example, *Surface Science*, 132, pp. 456–464 (Zur et al), 469–478 (Margaritondo), 513–518 (Waldrop et al) and 543–576 (Kroemer), 1983. In particular, Zur et al suggest that a dipole formed by defects of opposite charge might be used to vary the heterojunction band offsets. However, detailed knowledge, or even consensus, among those skilled in the art, of the parameters that would enable the heterojunction characteristics to be controllably varied is lacking.

SUMMARY OF THE INVENTION

We have found that the barrier heights and the energy band discontinuities at a heterojunction interface in a heterojunction semiconductor device may be controllably varied by introducing an interface dipole near the heterojunction interface. The device has a first region of a first semiconductor material and a second region of a second semiconductor material, the first and second regions having an interface; and a first charge sheet with a first conductivity type and a second charge sheet of a second conductivity type near the heterojunction interface. At least one of the charge sheets is formed by heavy doping. In a preferred embodiment, both charge sheets are formed by doping and form a doping interface dipole. In a further preferred embodiment, the charge sheets are on opposite sides of the interface. The positions of the charge sheets are within approximately the lesser of a carrier mean free path or a thermal de Broglie wavelength of the interface. Still closer spacing, typically less than approximately 10 atomic layers from the interface, permits control of the energy band discontinuities by making the dipole region effectively transparent to carriers. Additionally, in yet another preferred embodiment, the charge densities in both charge sheets are approximately equal. Although the conduction and valence bands in the first region are shifted with respect to the conduction and valence bands in the second region when the doping interface dipole is introduced, the choice of the charge orientation of the charge sheets determines the direction of the relative shift. This permits essentially arbitrary tuning of the barrier height and the energy band discontinuities. The doping interface dipole is useful in many types of heterojunction devices including lasers, photodetectors, field effect and bipolar transistors, etc. The carrier transport may be either parallel or perpendicular to the heterojunction interface.

DETAILED DESCRIPTION

For reasons of clarity, the elements of the devices and the energy band diagrams depicted are not drawn to scale. For reasons of simplicity, the effects of band bending in the charge sheets has been neglected.

Figure 1:
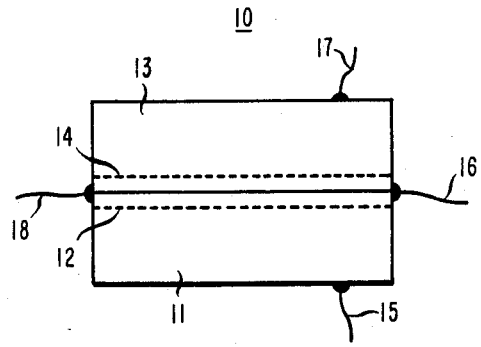
FIG. 1 is a sectional view of a heterojunction device having a doping interface dipole.

FIG. 1 is a sectional view of a device according to this invention having a doping interface dipole. The device, indicated generally as 10, comprises a narrow bandgap region 11 comprising a first semiconductor and a wide bandgap region 13 comprising a second semiconductor. There is also a doping interface dipole at the heterojunction interface. The doping interface dipole comprises charge sheet 12 and charge sheet 14 with the two charge sheets disposed on opposite sides of the interface, i.e., sheets 12 and 14 are in regions 11 and 13, respectively. Contacts 15 and 17 electrically contact regions 11 and 13, respectively, when charge transport perpendicular to the interface is desired. If charge transport parallel to the interface is desired, contacts 16 and 18, on opposite ends of the device, may be used as may any other electrode configuration which applies an electric field parallel to the interface. Regions 11 and 13 may be intrinsic, and, as will be discussed later, they may alternatively have either the same or opposite conductivity types. However, the doping interface dipole is most effective in regions with no free charge. For purposes of explanation, the regions will first be assumed to be ideally intrinsic.

Figure 2:
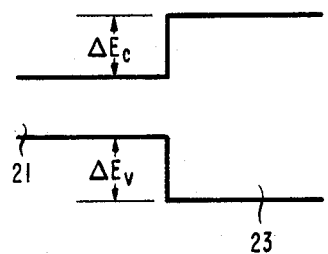
FIG. 2 is a schematic representation of an intrinsic semiconductor heterojunction energy band diagram.

The influence of the doping interface dipoles on the energy band diagram of the device of FIG. 1 will be discussed in reference to an exemplary heterojunction energy band diagram. To simplify understanding of the energy band diagram, band bending effects over the short distance depicted have been neglected. The energy band diagram of such an ideal heterojunction is depicted in FIG. 2. There is a region 21 of a first semiconductor material and a region 23 of a second semiconductor material. The first and second materials have first and second energy bandgaps, respectively, with the first bandgap being less than the second bandgap. The conduction band discontinuity is $\Delta E_c$ and the valence band discontinuity is $\Delta E_v$.

Figure 3:
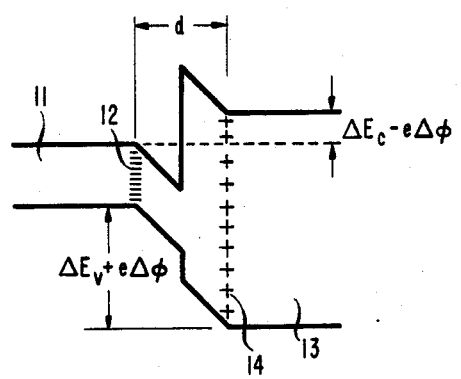
FIG. 3 is the energy band diagram for the heterojunction of FIG. 2 with a dipole according to our invention.

The energy band diagram for the heterojunction of FIG. 2 and device of FIG. 1 is depicted in FIG. 3 with the doping interface dipole being present. The positive and negative charge sheets comprise ionized donors and acceptors, respectively, introduced during crystal growth. Each charge sheet has a width t and the spatial separation between the sheets is d. The width, t, is small and, as a result, the donors and acceptors are ionized leading to carrier depletion in both charge sheets. The width t may be taken as the width of the charge sheets with the understanding that the elements are not to scale. The charge per unit area in each sheet is $\sigma$. The doping interface dipole is thus essentially a microscopic capacitor. The electric field between the charge sheets is $\sigma/\epsilon$ where $\epsilon$ is the dielectric constant, and for simplicity of discussion, it is assumed that the dielectric constants of the two semiconductor materials are the same. The potential difference, $\Delta\phi$, between the charge sheets is $\Delta\phi = \sigma d/\epsilon$. Accordingly, the doping interface dipole produces a rapid step-like potential variation near the interface, thereby changing the energy band alignment near the interface. The relative positions of the valence and conduction band in the two regions outside of the dipole region are changed. In the embodiment depicted, negative and positive charges are on the left and right of the interface, respectively. That is, sheets 12 and 14 have p- and n- type conductivity, respectively, and are completely depleted. The energy bands for region 11 are both moved upward with respect to the energy bands for region 13. Outside of the dipole region, the conduction band offset is reduced by $e\Delta\phi$ where e is the electronic charge while the valence band offset is increased by the same amount.

This change in the energy band diagram is better understood from the following considerations. The potential difference due to the dipole is $\sigma d/\epsilon$. Accordingly, the valence band barrier may be viewed as having increased by the dipole potential energy $e\sigma d/\epsilon$. Similar considerations apply to the conduction band barrier.

Figure 4:
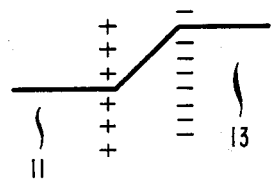
FIGS. 4–7 show the effects of the doping interface dipoles on the conduction band discontinuity and the electrostatic potential for two dipole charge orientations.
Figure 5:
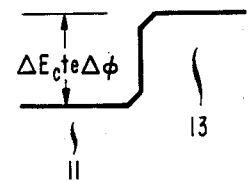
Figure 6:
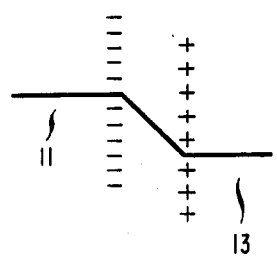
Figure 7:
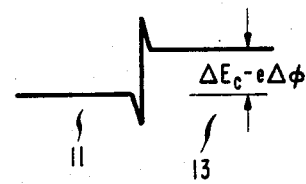

The effect of the doping interface dipole on the energy band diagram may perhaps be better understood by reference to FIGS. 4–7. These energy band diagrams will be discussed with respect to electrons moving from left to right. FIGS. 4–5 depict the potential variation and shift in conduction band discontinuity, respectively, for a retarding doping interface doping and FIGS. 6–7 are the corresponding diagrams for an accelerating doping interface dipole. The retarding dipole has positive and negative charge sheets in the narrow and wide bandgap regions, respectively. The accelerating dipole has negative and positive charge sheets in the narrow and wide bandgap regions, respectively.

As can be seen from FIG. 4, the potential increases across the dipole and the conduction band discontinuity increases, FIG. 5, thus retarding the electron. The potential decreases as shown in FIG. 6 resulting in the decrease in conduction band discontinuity shown in FIG. 7. Accordingly, the electron will be accelerated. Similar considerations apply, as will be readily appreciated by those skilled in the art, to the valence band discontinuity and the effect of the dipole on hole transport properties.

The charge sheets should be within the lesser of approximately an electron thermal de Broglie wavelength or an electron mean free path of the interface for barrier height tuning. In the embodiment depicted, the tuning has been done primarily to enhance the electron transport characteristics. If the tuning is performed primarily for holes, the distance of the charge sheets from the heterojunction will be determined by the hole thermal de Brogile wavelength or mean free path. They typically will be within 500 Angstroms of the interface. The thermal de Broglie wavelength is determined by using the de Broglie equation, $\lambda = h/p$, where $\lambda$ is the wavelength, h is Planck's constant and p is the momentum p is $mv_{th}$ where m is the carrier effective mass and $v_{th}$ is the thermal velocity, $$v_{th} = \sqrt{\frac{3kT}{m}}$$

where T is the absolute temperature and k is Boltzmann's constant. Greater distances are undesirable because of the full possible effect of the doping interface dipole on carrier transport properties may not be realized. The doping density is typically within the range from approximately $10^{17}/cm^3$ to approximately $10^{19}/cm^3$. That is, the charge sheet is heavily doped means that it has a doping concentration of at least approximately $10^{17}/cm^3$. The width of the sheet is small enough, typically approximately 100 Angstroms, so that both the acceptor and donor charge sheets are depleted of carriers.

As can be seen from FIGS. 3–7, there is a triangular energy well at the low bandgap side of the heterojunction interface for the accelerating dipole. However, in practice this energy well does not behave as does a classical energy well, but rather as a quantum well. This is understood when it is realized that the electric field in the dipole region is typically about $10^5$ V/cm, and the dipole potential difference is approximately 0.1 to 0.2 eV. The skilled artisan can now easily show that the first, i.e., lowest energy level in the well, is very close to the top of the well. If the carriers are ballistic, they will, in effect, not see the energy well because they do not scatter in it. That is, the well width is less than the carrier mean free path. If the carriers do thermalize, their energy states will be near the top of the quantum well because of the quantum effects. This effectively decreases the height of the barrier and greatly increases the probability of thermionic emission of electrons over the barrier. An analysis shows that the thermionic emission probability increases approximately by exp-$(e\Delta\phi/2kT)$. As kT is small, approximately 0.025 eV, at room temperature, this is a considerable enhancement in the emission probability even if $e\Delta\phi$ is only 0.1 eV. It is also apparent that electrorms can easily tunnel through the triangular barrier provided that it is thin i.e., less than approximately 100 Angstroms in width.

The energy band discontinuities may be varied if the charge sheets forming the doping interface dipole are within several, typically 1 to 5, atomic layers of the interface. If the dipole potential difference, $\Delta\phi$, is dropped over several atomic layers, the valence band discontinuity in FIG. 3 is effectively increased by $e\Delta\phi$ where $\Delta\phi$ is the dipole potential. The dipole potential reduces the energy difference between the conduction band edges thus reducing the conduction band discontinuity to $\Delta E_c - e\Delta\phi$. A similar analysis is now easily made by the skilled artisan for the other dipole orientation.

Devices using doping interface dipoles near a heterojunction interface are conveniently fabricated by growth techniques, such as molecular beam epitaxy or metallorganic chemical vapor deposition, that permit fabrication of abrupt compositional and doping profiles. The semiconductor materials are selected from the group consisting of Group III-V, Group IV and Group II-VI semiconductors. Particularly useful combinations include InGaAsP/InP, AlGaAsSb/GaSb, AlGaAsSb-/AlSb, and AlInGaAs/AlInAs.

Other embodiments in addition to those explicitly mentioned previously with respect to FIG. 3 are contemplated. For example, regions 11 and 13 may both have n-type conductivity or p-type conductivity, respectivity, or they may have different, i.e., first and second, conductivity types. As will be readily appreciated by those skilled in the art, the energy band diagram at the interface will not be the same as that depicted in FIG. 3 for other conductivity configurations. Other modifications of the embodiment depicted with respect to FIGS. 1–3 are contemplated. For example, the conductivity types of the two charge sheets may be reversed. The discussion of FIGS. 4 and 5 shows the skilled artisan that the changes in the valence and conduction band discontinuities will also be reversed, with respect to the changes shown in FIG. 3, in this embodiment. Thus, the energy bands of region 11 move downward with respect to those of region 13. Although the charge sheets are depicted as being symmetric with respect to their total charge and spacing from the interface, deviations from this symmetry are possible. The total charge in the sheets need not be precisely equal. However, it is desirable in a preferred embodiment that they differ by less than 20 percent to avoid large variations in the electric field outside of the dipole region. The charge sheets also need not be positioned the same distance from the interface. In another embodiment, they are on the same side of the interface. Additionally, one of the charge sheets may be formed by defects or tilt doping. The latter type of doping arises at polar/-nonpolar interfaces when bonds, due to a misorientation, are rolled out of the interface by a small angle. The result is a small, but finite, interface charge. See, for example, the previously mentioned article by Kroemer, especially page 573.

Figure 8:
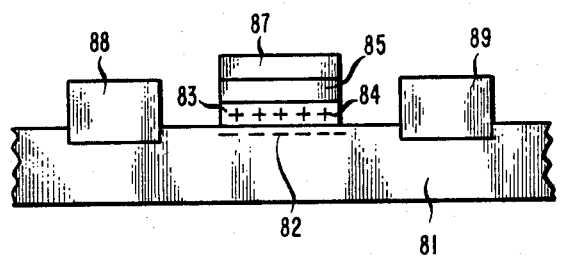
FIG. 8 is a schematic representation of a field effect transistor according to our invention.

Numerous device applications will be readily thought of. For example, the heterojunction depicted is useful in a field effect transistor. Such a device is depicted in FIG. 8. Depicted are narrow bandgap region 81, wide bandgap region 83, region 85, metal layer 87, source and drain electrodes 88 and 89, respectively, and first charge sheet 82 and second charge sheet 84 located in regions 81 and 83, respectively. Region 81 has p-type or n-type conductivity, region 83 is undoped and region 85 has heavily doped n-type conductivity. Regions 81 and 85 may be GaAs and region 83 may be AlGaAs. The first and second charge sheets are negative and positive, respectively. That is, they have p-type and n-type conductivity, respectively.

The doping interface dipole moves the energy bands of region 81 down with respect to the energy bands of region 83. Accordingly, an energy well is formed, or the depth of an existing well is increased, at the heterojunction interface favoring the formation of an accumulation layer formed if region 81 is n-type, and the device is normally ON. If a positive voltage is applied to the n+ layer, i.e., the gate, the formation of an inversion layer will be favored if region 81 is p-type.

Other embodiments are contemplated. For example, both charge sheets may be in region 81.

Still other device applications are contemplated and several will be discussed in some detail. These applications, as well as those already discussed, involve carrier transport both parallel and perpendicular to the heterojunction interface.

Figure 9:
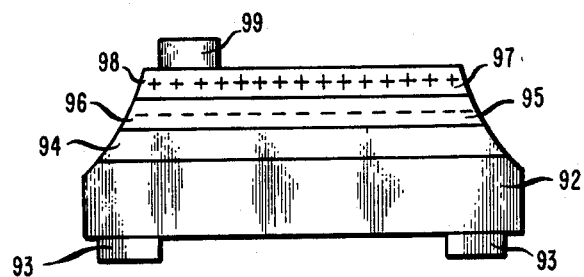
FIG. 9 is a schematic representation of an avalanche photodetector having a doping interface dipole.

FIG. 9 depicts a heterojunction separate absorption and multiplication avalanche photodetector according to our invention. The device comprises substrate 92, region 94, multiplication region 96, and absorption region 98. What is termed the substrate may also include a buffer layer of the same conductivity. The substrate 92 and absorption region 98 are contacted by electrical contacts 93 and 99, respectively. Contact 93 may be ring shaped but need only be transparent or have an opening. Region 99 may be heavily doped to facilitate formation of an ohmic contact. Regions 98 and 99 have a bandgap less than the bandgap of regions 94 and 96. Regions 96 and 98 have a first conductivity type, and region 94 and substrate 92 have a second conductivity type. There is a doping interface dipole comprising charge sheets 95 and 97 in regions 96 and 98, respectively. In one illustrative embodiment, the first and second conductivity types are n- and p-type, respectively. Regions 98 and 99 comprise InGaAs and regions 94 and 96, as well as substrate 92, comprise InP. The presence of the interface doping dipole reduces the valence band barrier height and increases the conduction band barrier height.

Figure 10:
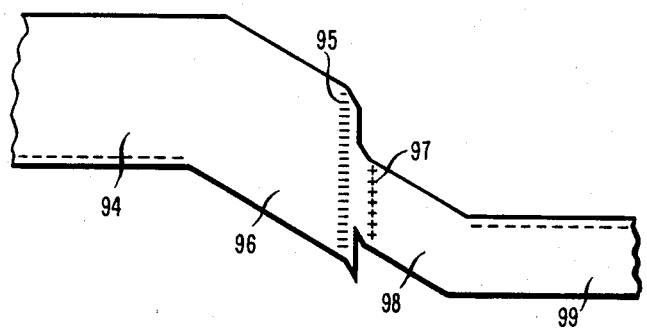
FIG. 10 is the energy band diagram for the device depicted in FIG. 9.

The energy band diagram for this device is depicted in FIG. 10. The dashed lines show the Fermi level. The first and second conductivity types are n and p, respectively. Charge sheets 95 and 97 comprise acceptors and donors, respectively. The result of the shifts in barrier heights produced by the doping interface dipole is that the holes are not trapped at the interface as the valence band barrier height is decreased by an amount $eFd$, where F is the electric field at the interface and d is the length of the dipole region. This is understood by considering that light is absorbed in the narrow bandgap regions and the electrons and holes move to the right and left, respectively. For a doping interface dipole close to the interface, the barrier width will also be reduced permitting holes to tunnel through the barrier. Quantum effects may also reduce the effective barrier height in this case.

Although only a single heterojunction with a doping interface dipole is depicted, it will be readily appreciated that doping interface dipoles may be used in avalanche photodetectors having more than one heterojunction. For example, doping interface dipoles may be used in superlattice photodiodes. It will also be readily appreciated that as the dipole makes the conduction band barrier height greater for electrons, it not only reduces hole trapping but also increases the ionization probability for electrons. This is advantageous in a superlattice avalanche photodiode as well as in other photodiodes in which it is desirable to increase the ionization probability for one type of carrier.

Figure 11:
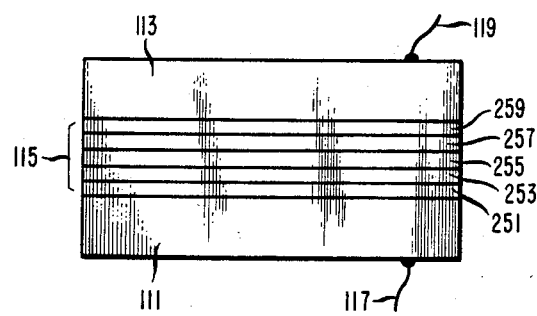
FIG. 11 is a schematic representation of a heterojunction laser having a plurality of doping interface dipoles.

FIG. 11 depicts a heterojunction laser having doping interface dipoles at each heterojunction. The laser depicted comprises cladding layers 111 and 113 having first and second conductivity types, respectively, and active region 115 positioned between the cladding layers. Layers 111 and 113 are contacted by electrical contacts 117 and 119, respectively. The active region 111 depicted is a multilayer region which comprises a plurality of layers 251, 253, 255, 257, and 259. More or fewer layers than depicted may be present in the active region. The layers in the active region have alternating high and low bandgaps. Of course, if only a single layer is present, it will have a bandgap less than the bandgaps of the cladding layers. There are doping interface dipoles at one or more of the heterojunctions.

Figure 12:
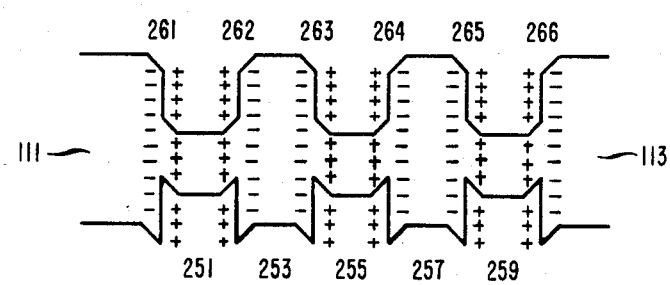
FIG. 12 is the energy band diagram for the laser depicted in FIG. 11.

The doping interface dipoles and an exemplary energy band diagram are depicted in FIG. 12. The dotted lines represent the energy band diagram without the doping interface dipoles. Six doping interface dipoles 261, 262, 263, 264, 265, and 266 are depicted. The positive charge sheets, i.e., the n-type sheets, are in the narrow bandgap layers and the negative charge sheets, i.e., the p-type sheets, are in the wide bandgap layers.

In the multilayer embodiment, the layer thicknesses in the active region should be selected, in a well known manner, so that quantum effects are significant and that carriers may tunnel from one well to another through the intervening barrier layer. If only a single layer is present in the active layer, it need not be sufficiently thin that quantum effects are important.

The doping interface dipoles depicted increase the effective conduction band discontinuity and decrease the valence band discontinuity. Consequently, there will be less electron leakage from the active region, and $T_0$ is improved. A higher value of $T_0$ means that lasing will begin at a lower threshold current, $J_{th}$, and $J_{th}$ is proportional to $\exp(T/T_o)$ where T is the temperature of the heat sink that the laser is mounted on. The holes, in most semiconductors, have a high effective mass and will not readily pass over or through the reduced barrier. The doping interface dipoles need not be present at all heterojunction interfaces. It will also be readily appreciated that other layers, for example, buffer layers, may be present.

Figure 13:
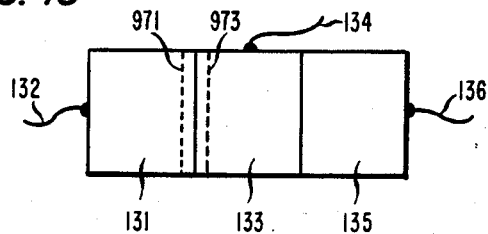
FIG. 13 is a schematic representation of a bipolar heterojunction transistor having a doping interface dipole.

FIG. 13 depicts a bipolar heterojunction transistor having an interface doping dipole. Depicted are emitter region 131, base region 133 and collector region 135. The emitter and collector regions have a first conductivity type and the base region has a second conductivity type. The emitter, base and collector regions are contacted by electrical contacts 132, 134 and 136, respectively. In a preferred embodiment, the emitter region has a bandgap greater than that of the base region. The interface of the emitter and base regions has a doping interface dipole comprising charge sheets 971 and 973 which are donor and acceptor, respectively. The doping interface dipole increases emitter injection efficiency, and current gain β as the valence band barrier is increased at the emitter-base interface.

Figure 14:
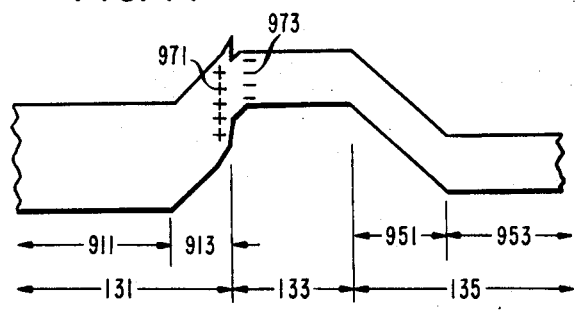
FIG. 14 is the energy band diagram for the transistor depicted in FIG. 13.

The device operation may be better understood by reference to the energy band diagram, depicted in FIG. 14, for the device of FIG. 13. The emitter region has a lightly doped n-type region 913 adjacent the base region and an n+ region 911 further away. The base region has p+ conductivity and the collector region has n-type conductivity with a lightly doped region 951 adjacent the base region, and a more heavily doped region 953 adjacent region 951. It may be desirable to have an undoped region near the emitter-base interface on the base side to avoid dopant diffusion from the base into the emitter. The negative charge sheet is desirably placed within this undoped region. The doping interface dipole increases the effective valence band discontinuity thereby increasing hole confinement in the base region. This results in increased current gain. It should be noted that the emitter could be doped uniformly n-type. Only the acceptor sheet in the base is then required to form the desired doping interface dipole.

It is evident that a tunneling emitter is also possible if the conduction band of the base region is below the bottom of the potential well in the emitter region, i.e., if the energy bands outside the dipole region are staggered.

Figure 15:
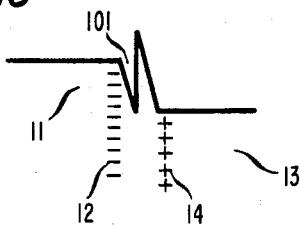
FIG. 15 is the conduction band diagram for a staggered heterojunction.

The conduction band diagram, FIG. 15, for a heterojunction such as that depicted in FIG. 3, with the doping interface dipole having a potential such that the conduction band of the wide bandgap region 13 is below the conduction band of the narrow bandgap region 11, is depicted. Electrons can be trapped in the triangular energy well. The electrons in the well are in a metastable energy state, i.e., they are stored, which they can leave by a tunneling process. The tunneling process may, however, have a relatively long lifetime.

Figure 16:
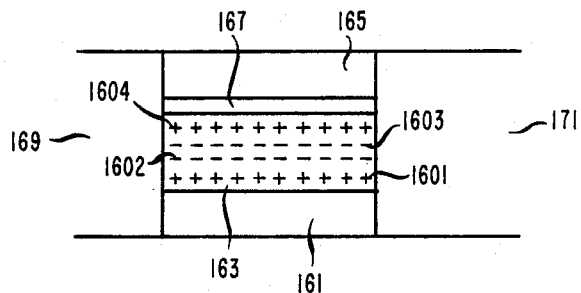
FIG. 16 is a schematic representation of a real space transfer device.
Figure 17:
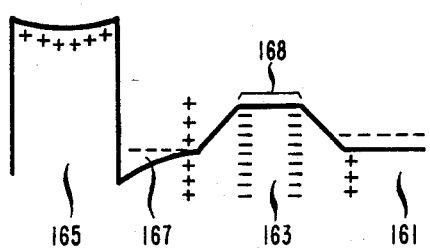
FIG. 17 is the energy band diagram for the device depicted in FIG. 16.

Still other device applications will be readily thought of. For example, real space transfer devices are contemplated. If an electric field is now applied parallel to the interface, the dipole will reduce the threshold field required for negative differential resistance due to real space transfer from the well the electron is in initially to a second well. A useful structure for such a device is depicted in FIG. 16 and the corresponding energy band diagram is depicted in FIG. 17. The real space transfer device depicted comprises highly doped n-type narrow bandgap region 161, region 163 which is undoped, and wide bandgap region 165. Region 165 is doped and consequently, a two-dimensional electron gas 167 forms at the interface of regions 163 and 165. Region 163 has four charge sheets forming two doping interface dipoles with alternate charge configurations. The dipoles cause the conduction band to move upward and result in the formation of two potential wells. Electrical contacts 169 and 171 are formed by highly doped n+ regions contacting opposite sides of the regions described.

The energy band diagram of this device is depicted in FIG. 17. As the electric field between contacts 169 and 171 is increased, some electrons in the electron gas 167 acquire enough energy to surmount the potential barrier 168 and move to the degenerately doped region 161. In this region, they have lower mobility than they had in gas 167 and negative differential resistance results.

Still other embodiments will be thought of by those skilled in the art. For example, although FIG. 2 is described with respect to wide and narrow bandgap semiconductors, there are also embodiments in which the conduction band of region 21 is below that of region 23 although region 21 has a bandgap greater than that of region 23. In this case, electrons will be confined in region 21 and holes will be confined in region 23. Still other variations will be ready thought of.

What is claimed is:

1. A heterojunction device comprising at least a first region of a first semiconductor material and at least a second region of a second semiconductor material, said first and said second regions having a first heterojunction interface, and a first interface dipole, said dipole comprising a first charge sheet and a second charge sheet, said first and second charge sheets being spatially separated from each other and comprising ionized donors and acceptors, respectively, at least one of said charge sheets being a heavily doped region, said charge sheets being within the lesser of a carrier mean free path or a thermal de Broglie wavelength of said interface.

2. A device as recited in claim 1 in which said charge sheets are in the same region.

3. A device as recited in claim 1 in which said charge sheets are in different regions.

4. A device as recited in claim 2 or 3 in which said charge sheets are less than the thermal de Broglie wavelength from said interface.

5. A device as recited in claim 4 in which said charge sheets are less than approximately 10 atomic layers from said interface.

6. A device as recited in claim 1 in which said first region has a bandgap greater than the bandgap of said second region.

7. A device as recited in claim 6 comprising a two-dimensional carrier gas at said interface.

8. A device as recited in claim 7 comprising first and second electrical contacts to said second region and a third electrical contact to said first region.

9. A device as recited in claim 6 further comprising a third region of a third semiconductor material, said third region and said second region having a second interface.

10. A device as recited in claim 9 in which said first and said second regions have opposite conductivity types.

11. A device as recited in claim 10 in which said third region has the conductivity type of said first region.

12. A device as recited in claim 11 further comprising first, second and third electrical contacts to said first, second and third regions, respectively.

13. A device as recited in claim 6 in which said first and said second regions have the same conductivity type.

14. A device as recited in claim 13 further comprising a third region, said third region and said first region having a second interface.

15. A device as recited in claim 14 in which said third region has a bandgap greater than the bandgap of said second region.

16. A device as recited in claim 15 in which said third region has a conductivity type opposite to said conductivity type of said region.

17. A device as recited in claim 16 further comprising first and second electrical contacts to said second and third regions, respectively.

18. A device as recited in claim 9 in which said third region has a bandgap greater than the bandgap of said second region.

19. A device as recited in claim 18 further comprising a second doping interface dipole, said second dipole comprising a third charge sheet and a fourth charge sheet, said third and fourth charge sheets being spatially separated from each other and comprising ionized donors and acceptors, respectively, at least one of said charge sheets being a heavily doped region, being within the lesser of a carrier mean free path or a thermal de Broglie wavelength of said second interface.

20. A device as recited in claim 19 in which said first and third regions have opposite conductivity types.

21. A device as recited in claim 1 further comprising means for establishing an electric field parallel to said interface.

22. A device as recited in claim 1 further comprising means for establishing an electric field perpendicular to said interface.

23. A device as recited in claim 1 in which said charge sheets have thicknesses less than approximately 100 Angstroms.

24. A device as recited in claim 1 in which said charge sheets having doping concentrations within the range from approximately $10^{17}/cm^3$ to approximately $10^{19}/cm^3$.

25. A device as recited in claim 1 in which said semiconductor materials are selected from the group consisting of Group IV, Group III-V and Group II-VI semiconductors.

26. A device as recited in claim 25 in which at least one of said semiconductor materials comprises a Group IV element.

27. A device as recited in claim 25 in which at least one of said semiconductor materials comprises a Group III-V compound semiconductor.

28. A device as recited in claim 27 in which said Group III-V semiconductors are selected from the group consisting of InGaAsP, AlGaAsSb, and AlInGaAs.

29. A device as recited in claim 6 in which the conduction band of said first region is below the conduction band of said second region.

* * * * *